(12) United States Patent
Diduck

(10) Patent No.: US 9,806,678 B2
(45) Date of Patent: Oct. 31, 2017

(54) BOOTSTRAP CLASS-D WIDEBAND RF POWER AMPLIFIER

(71) Applicant: Eridan Communications, Inc., San Francisco, CA (US)

(72) Inventor: Quentin Diduck, Santa Clara, CA (US)

(73) Assignee: Eridan Communications, Inc., San Francisco, CA (US)

( * ) Notice: Subject to any disclaimer, the term of this patent is extended or adjusted under 35 U.S.C. 154(b) by 0 days.

(21) Appl. No.: 14/754,656

(22) Filed: Jun. 29, 2015

(65) Prior Publication Data

US 2016/0380600 A1     Dec. 29, 2016

(51) Int. Cl.
| | |
|---|---|
| H03F 3/217 | (2006.01) |
| H03F 1/42 | (2006.01) |
| H03F 1/02 | (2006.01) |
| H03F 3/193 | (2006.01) |

(52) U.S. Cl.
CPC ............ *H03F 1/42* (2013.01); *H03F 1/0205* (2013.01); *H03F 1/0233* (2013.01); *H03F 3/193* (2013.01); *H03F 3/2173* (2013.01); *H03F 2200/351* (2013.01); *H03F 2200/36* (2013.01); *H03F 2200/451* (2013.01)

(58) Field of Classification Search
CPC ........................................................ H03F 1/42
USPC .... 330/10, 251, 302–206, 207 A, 207 P, 285
See application file for complete search history.

(56) References Cited

U.S. PATENT DOCUMENTS

| | | | | |
|---|---|---|---|---|
| 3,531,660 A * | 9/1970 | Engberg | ................. | H03K 5/02 326/30 |
| 8,063,616 B2 * | 11/2011 | Bahramian | ............ | H02M 1/08 323/271 |
| 8,149,027 B2 * | 4/2012 | Cygan | .................. | H03F 3/2173 327/110 |
| 2005/0168288 A1 * | 8/2005 | Li | .......................... | H03F 1/301 330/298 |
| 2015/0042403 A1 * | 2/2015 | Laturell | ................ | H03F 3/2175 330/251 |

OTHER PUBLICATIONS

International Search Report (ISR) and Written Opinion (WO) from International Searching Authority, PCT International Patent Application No. PCT/US2016/028458.

* cited by examiner

*Primary Examiner* — Khanh V Nguyen
*Assistant Examiner* — Khiem Nguyen
(74) *Attorney, Agent, or Firm* — William E. Winters; Patent Law Professionals, P.C.

(57) ABSTRACT

A high-power, high-frequency radio frequency power amplifier includes an output stage and a single-phase driver. The output stage is arranged in a Class-D amplifier configuration and includes a first depletion mode field effect transistor (FET), a second depletion mode FET, and a bootstrap path that couples the output of the output stage to the gate of the second FET. The first and second depletion mode FETs are switched out-of-phase and between fully-ON and fully-OFF states, under the direction of the single-phase driver. The single-phase driver directly controls the ON/OFF state of the first depletion mode FET and provides a discharge path through which the input gate capacitor of the second depletion mode FET in the output stage can discharge to turn OFF the second depletion mode FET. The bootstrap path provides a current path through which the input gate capacitor of the second depletion mode FET can charge to turn the second depletion mode FET ON.

8 Claims, 6 Drawing Sheets

BOOTSTRAP CLASS-D WIDEBAND RF POWER AMPLIFIER

STATEMENT REGARDING FEDERALLY SPONSORED RESEARCH OR DEVELOPMENT

This invention was made with Government support under Contract No. FA8750-14-C-0099 awarded by the Air Force Research Laboratory on behalf of DARPA. The Government has certain rights in the invention.

BACKGROUND OF THE INVENTION

Radio frequency power amplifiers (RF PAs) are used to convert low-power RF signals into high-power RF signals. In some applications it is desired or required for the RF PA to be capable of producing high-power RF signals at microwave frequencies. Designing an RF PA having this capability and which is also capable of operating with high energy efficiency over a wide range of microwave frequencies poses various difficult design challenges. The invention described below addresses these challenges.

BRIEF SUMMARY OF THE INVENTION

High-power, high-frequency radio frequency power amplifiers (RF PAs) are disclosed. An exemplary RF PA includes a high-power, high-frequency output stage and a single-phase driver. The high-power, high-frequency output stage is arranged in a Class-D amplifier configuration and includes a first depletion mode field effect transistor (FET), a second depletion mode FET, and a bootstrap path that couples the output of the Class-D output stage to the gate of the second FET. The first and second depletion mode FETs are switched between fully ON (saturated) and fully-OFF (cut-off) states, under the direction of the single-phase driver, which operates according to variations in an input RF signal $RF_{in}$ provided by an external RF source. The first and second depletion mode FETs are switched out of phase so that when the first depletion mode is ON the second depletion mode FET is OFF, and vice versa, thus allowing the output stage to operate with high energy efficiency. When the first depletion mode FET is being switched ON and the second depletion mode FET is being switched OFF, the single-phase driver provides a discharge path through which the input gate capacitor of the second depletion mode FET in the output stage can discharge. Discharging the input gate capacitor causes the source-drain channel of the second depletion mode FET to pinch off, thereby turning the second depletion mode FET OFF. Conversely, when the first depletion mode FET is being switched OFF and the second depletion mode FET is being switched ON, the bootstrap path provides a current path through which the input gate capacitor of the second depletion mode FET can charge. The accumulated charge induces a high conductivity channel beneath the gate of the second depletion mode FET and between its drain and source, thereby causing the second depletion mode FET to turn ON.

The RF PA of the present invention has a number of significant advantages over conventional RF PAs. First, the single-phase driver avoids the complexity and circuitry needed to generate and control two separate out-of-phase drive signals. Second, because the RF PA is a nonlinear, switch-based design, it is substantially more energy efficient than non-switched RF PAs. This advantage together with the uncomplicated single-phase driver design allow a much smaller heatsink to be used to dissipate heat generated by the RF PA, compared to what is required for a non-switched, linear RF PA of comparable RF output power. Third, the RF PA does not require a large drain inductor, as is necessary in single-ended RF PA approaches. Eliminating the need for a large drain inductor and the uncomplicated single-phase driver design minimizes the footprint of the RF PA and allows the RF PA to be manufactured in a small, compact monolithic microwave integrated circuit (MMIC). Fourth, the RF PA is capable of operating over a wide range of microwave frequencies. In fact, the RF PA is capable of producing high RF output powers at high conversion efficiencies over a bandwidth of microwave frequencies that exceeds one decade.

In one embodiment of the invention the FETs of the RF PA are implemented using aluminum gallium nitride/gallium nitride (AlGaN/GaN) high electron mobility transistors (GaN HEMTs). GaN HEMTs can be manufactured to have very high breakdown voltages (hundreds of volts) and have exceptional electron transport properties (for example, drift velocities approaching $3 \times 10^7$ cm/s). This combination of attributes allows the RF PA to be used in radar applications, advanced communications systems, and high-power converters. GaN-HEMTs can also be manufactured to have an order of magnitude or greater power density than conventional silicon (Si) based and gallium arsenide (GaAs) based FETs. Although the RF PA of the present invention is not restricted to using GaN-HEMTs, when they are used, the advantage that is gained further reduces the footprint of the RF PA and the size of the MMIC in which it is fabricated. In fact, when using GaN-HEMTs, the size of the resulting MMIC of the RF PA can be made substantially smaller than when more-conventional depletion mode FETs are used. The small individual size of each GaN-HEMT, the superior power density of the GaN-HEMT, the uncomplicated design of the RF PA, and not requiring a large drain inductor, all together allow the size of the MMIC to be substantially smaller than conventional RF PA MMICs. In some instances, the size of the MMIC can even be made ten times smaller than conventional RF PA MMICs of comparable output power.

Further features and advantages of the invention, including a detailed description of the above-summarized and other exemplary embodiments of the invention, will now be described in detail with respect to the accompanying drawings, in which like reference numbers are used to indicate identical or functionally similar elements.

DETAILED DESCRIPTION

Figure 1:
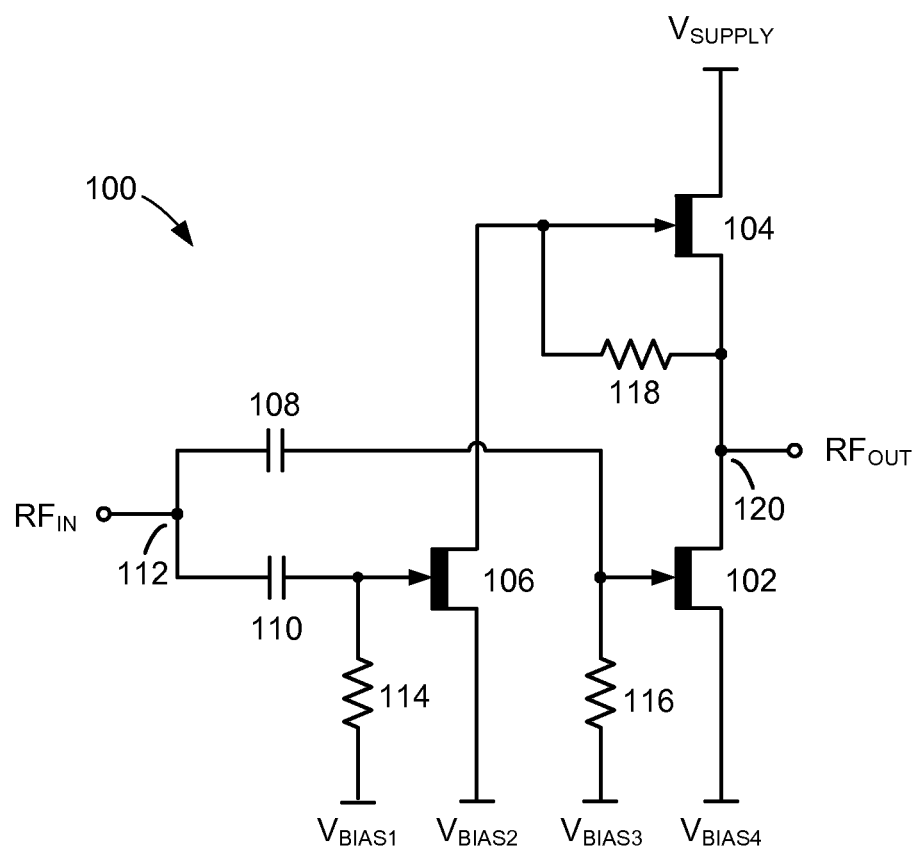
FIG. 1 is a schematic drawing of a high-power, high-frequency radio frequency power amplifier (RF PA), according to an embodiment of the present invention.

Referring to FIG. 1, there is shown a schematic drawing of a radio frequency (RF) power amplifier (PA) 100, according to an embodiment of the present invention. The RF PA 100 comprises a Class-D output stage and a single-phase driver. The Class-D output stage comprises first and second depletion mode depletion mode field effect transistors (FETs) 102 and 104, and a bootstrap resistor 118. The drain of the first FET 102 is connected to the source of the second FET 104. The drain/source connection serves as the RF output terminal 120 of the RF PA 100. The bootstrap resistor 118 is connected in a bootstrap path (or "feedback" path) between the RF output terminal 120 and the gate of the second FET 104, and is used to control the gate-source voltage $V_{GS}(104)$ applied across the gate-source terminals of the second FET 104. The single-phase driver directly controls the ON/OFF status of the first FET 102 in the output stage, and comprises a third depletion mode FET 106 which is used to provide a discharge path for the input gate capacitor of the second FET 104 during times the second FET 104 is being turned OFF.

In the exemplary embodiment of the RF PA 100 illustrated in FIG. 1, the first, second, and third depletion mode FETs 102, 104, and 106 comprise n-channel, depletion mode metal-semiconductor FETs (MESFETs) such as, for example, gallium arsenide (GaAs) MESFETs (or GaAs FETs). Accordingly, in FIG. 1, the first, second, and third FETs 102, 104, and 106 are each depicted using the conventional n-channel, depletion mode transistor symbol commonly used for n-channel, depletion mode MESFETs. It should be mentioned, however, that the RF PA 100 can be readily modified or adapted to employ other types of depletion mode devices such as, for example, p-channel MESFETs, n-channel or p-channel depletion mode junction field effect transistors (JFETs), or n-channel or p-channel depletion mode metal-oxide-semiconductor field effect transistors (MOSFETs). The depletion mode FETs 102, 104, and 106 of the RF PA can also be implemented using heterostructure FETs. For example, in a preferred embodiment of the invention the first, second, and third depletion mode FETs 102, 104, and 106 are all implemented using aluminum gallium nitride/gallium nitride (AlGaN/GaN) high electron mobility transistors (or "GaN-HEMTs").

Because the first, second, and third FETs 102, 104, and 106 are depletion mode devices, they are "normally on." A normally on FET means that at equilibrium, when no external voltages are being applied across the FET's gate-source terminals, a conducting channel is formed beneath the gate of the FET and between the FET's source and drain terminals. For n-channel depletion mode FETs, (such as are used in the RF PA 100 FIG. 1), the conducting channel is formed by electrons. Since electrons are negatively charged, a negative voltage must be applied across the gate-source terminals of each FET in order to "pinch off" the FET's conducting channel and thereby turn the FET OFF. The negative voltage that just pinches off the conducting channel is known as the "pinch-off voltage" or the "threshold voltage." Maintaining a $V_{GS}$ that is more negative than the threshold voltage $V_T$ will ensure that the conducting channel remains completely pinched off. Increasing the applied $V_{GS}$ so that it is more positive than the threshold voltage $V_T$ will allow the conducting channel to reform. The extent to which the channel reforms depends on how much more positive the applied gate-to-source voltage $V_{GS}$ is made relative to the threshold voltage $V_T$.

The first, second, and third FETs 102, 104, and 106 of the RF PA 100 are all operated as switches—being switched either fully ON (saturated) or fully OFF (cut-off). In the description that follows, each of the first, second, and third FETs 102, 104, and 106 will be considered to be fully ON when the gate-source voltage $V_{GS}$ applied across its gate-source terminals rises to a level of zero volts (0V) and to be fully OFF when the gate-source voltage $V_{GS}$ falls to a level equal to or less than (i.e., more negative than) the FET's threshold voltage $V_T$. In most n-channel, depletion mode FETs, a gate-source voltage $V_{GS}$ of 0V will be effective at allowing the conducting channel to fully form so that the FET is fully turned ON. It should be mentioned, however, that, depending on the actual type of depletion mode FET being used, including the material, electronic, and structural properties of the type of FET selected, a gate-source voltage $V_{GS}$ less than or greater than 0V may be sufficient to turn the selected FET fully ON. Accordingly, the $V_{GS}=0V$ fully-ON condition in the description that follows is used for explanatory purposes and to highlight the general operating characteristics of the exemplary RF PA 100 but not for the purpose of limiting the RF PA 100 to any particular type of depletion mode FET. It should also be mentioned that whereas it is possible for two or more of the first, second, and third FETs 102, 104, and 106 to have different threshold voltages, and the RF PA 100 could be modified or adapted to accommodate different-threshold devices, in a typical integrated circuit implementation, however, the threshold voltages $V_T$ would normally be the same for the first, second, and third FETs 102, 104, and 106. Accordingly, although not an absolute requirement insofar as the invention is concerned, in the description of the exemplary RF PA 100 that follows, it will be assumed that the threshold voltage $V_T$ is the same for all of the FETs 102, 104, and 106 of the RF PA 100.

The first and third FETs 102 and 106 of the RF PA 100 are switched ON and OFF according to the voltage of the input RF signal $RF_{in}$ received at an RF input 112 of the RF PA 100. The input RF signal $RF_{in}$ may or may not be angle-modulated (i.e., frequency- or phase-modulated), and whether it is or is not will depend on the particular application in which the RF PA 100 is being used. The input RF signal $RF_{in}$ is AC coupled to the gates of the first and third FETs 102 and 106, via first and second AC coupling capacitors 108 and 110. First and second bias resistors 114 and 116 and first and third DC bias supply voltages $V_{BIAS1}$ and $V_{BIAS3}$ are used to establish DC operating points $V_{DC}(102)$ and $V_{DC}(106)$ at the gates of the first and third FETs 102 and 106. The DC operating points $V_{DC}(102)$ and $V_{DC}(106)$ determine the DC voltages about which the input RF signal $RF_{in}$ swing at the gates of the first and third FETs 102 and 106 and are set so that the resulting DC-biased input RF signals $RF_{in}$ are effective at switching the first and third FETs 102 and 106 between fully-ON (saturated) and fully-OFF (cut-off) states.

Figure 2A:
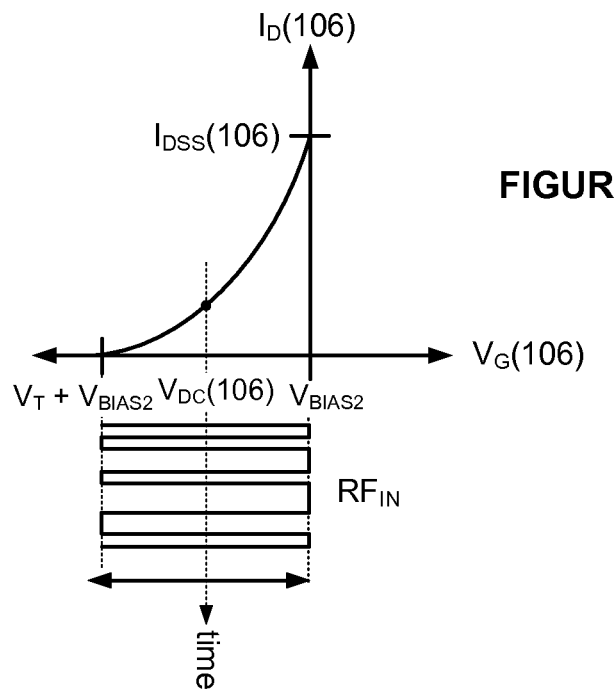
FIGS. 2A and 2B are drain current ($I_D$) versus gate voltage ($V_G$) curves, highlighting the DC biasing of the third and first FETs of the RF PA in FIG. 1.

The DC values for the DC operating points $V_{DC}(106)$ and $V_{DC}(102)$ are influenced by the presence of second and fourth DC bias supply voltages $V_{BIAS2}$ and $V_{BIAS4}$ applied to the sources of the third and first FETs 106 and 102. The output stage of the RF PA 100 is a Class-D output stage, meaning that when the first FET 102 is ON the second FET 104 is OFF, and vice versa. The ON/OFF status of the second FET 104 is controlled by the ON/OFF statuses of the first and third FETs 102 and 106, which turn ON and OFF synchronously under the control of the input RF voltage $RF_{in}$. When the first and third FETs 102 and 106 are ON, a voltage difference $V_{BIAS2}-V_{BIAS4}$ is applied across the gate-source terminals of the second FET 104. This voltage difference $V_{BIAS2}-V_{BIAS4}$ is dropped across the bootstrap resistor 118 when the second FET 104 is turned OFF and therefore must be equal to or less than (i.e., more negative than) the threshold voltage $V_T$ of the second FET 104, in order for the conducting channel of the second FET 104 to capable of being pinched OFF. In other words, $(V_{BIAS2}-V_{BIAS4})<V_T$. In one embodiment of the invention $V_{BIAS4}$ is set to 0V and $V_{BIAS2}$ is set to some negative voltage less than (i.e., more negative than) $V_T$. Assuming these values of $V_{BIAS2}$ and $V_{BIAS4}$ (i.e., $V_{BIAS2}<V_T$ and $V_{BIAS4}=0V$), the value for the first DC bias voltage $V_{BIAS1}$ and the value of the resistance of the first bias resistor 114 can be selected to establish the DC operating point $V_{DC}(106)$ for the third FET 106. As illustrated in FIG. 2A, biasing the gate of the third FET 106 to the DC operating point $V_{DC}(106)$ allows the gate voltage $V_G(106)$ of the third FET 106 to swing between a high value of $V_{BIAS2}$ and a low value of $V_T+V_{BIAS2}$ and consequently allows the gate-source voltage $V_{GS}(106)$ across the gate-source terminals of the third FET 106 to swing between a high of 0V and a low value of $V_T$. With the DC operating point of the third FET 106 set to $V_{DC}(106)$, the gate voltage $V_G(106)$ is therefore able to switch the third FET 106 between fully ON and fully OFF states.

Figure 2B:
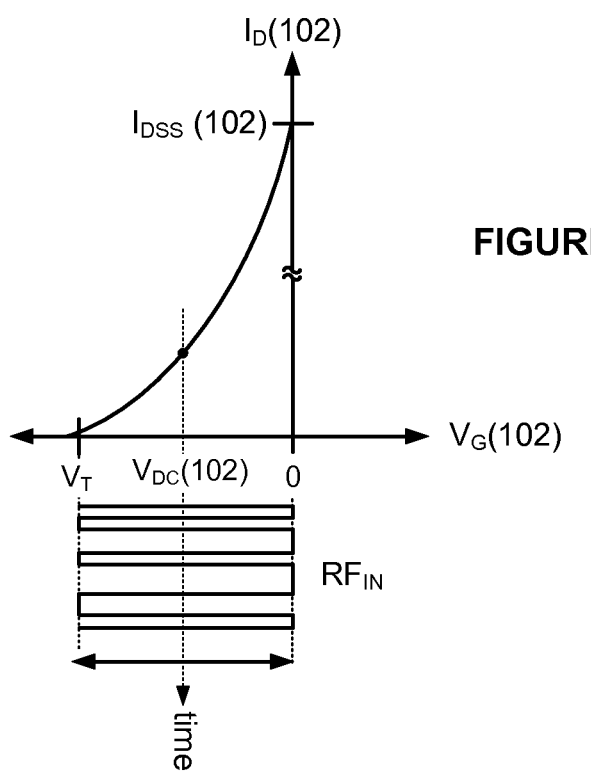

With $V_{BIAS4}=0V$ and $V_{BIAS2}<V_T$, the values of the third DC bias voltage $V_{BIAS3}$ and the value of the resistance of the second bias resistor 116 can also be selected to establish the DC operating point $V_{DC}(102)$ for the first FET 102. As illustrated in FIG. 2B, biasing the gate of the first FET 102 to the DC operating point $V_{DC}(102)$ allows the gate voltage $V_G(102)$ of the first FET 102 to swing between a high value of 0V and a low value of less than $V_T$ and thus allow the gate-source voltage $V_{GS}(102)$ across the gate-source terminals of the first FET 102 to also swing between 0V and a low value of $V_T$. With the DC operating point of the first FET 102 set to $V_{DC}(102)$, the gate voltage $V_G(102)$ is therefore able to switch the first FET 102 between fully ON and fully OFF states.

The third FET 106 has a significantly lower saturation current $I_{DSS}(106)$ than the saturation current $I_{DSS}(102)$ of the first FET 102 (compare FIGS. 2A and 2B). This difference in saturation currents is due to the fact that the first FET 102 forms part of the high-power output stage and must be capable of sinking large drain currents when turned ON. The third FET 106 does not need to sink (or source) large drain currents, since it only needs to drive the high-power output stage. Accordingly, the gate area $A(106)$ of the third FET 106 can be made smaller than the gate area $A(102)$ of the first FET 102. Like the first FET 102, the second FET 104 forms part of the high-power output stage and must be sized to source large drain currents. Accordingly, the gate area $A(104)$ is also made larger than the gate area $A(106)$ of the third FET 106. In one embodiment of the invention the gate areas $A(102)$ and $A(104)$ of the first and second FETs 102 and 104 are designed to be equal (i.e., $A(102)=A(104)$) and the gate area $A(106)$ of the third FET 106 is designed to be e times smaller than the gate areas $A(102)$ and $A(104)$ of the first and second FETs 102 are 104 or, in other words, $A(106)=A(102)/e=A(104)/e$, where "e" is the base of the natural logarithm (approximately 2.7). Since the first, second, third and FETs 102, 104, and 106 will typically, though not necessarily, have the same gate length, the widths of the FETs 102, 104, and 106 will be adjusted to set the desired or required gate areas during the layout of the RF PA integrated circuit. It should be mentioned that the lower output impedance of the second FET 104 (which operates as a common drain amplifier) compared to the relatively higher output impedance of the first FET 102 (which operates as a common source amplifier) can also be taken into consideration to allow the gate area $A(104)$ of the second FET 104 to be made somewhat smaller than the gate area $A(102)$ of the first FET 102.

Figure 3:
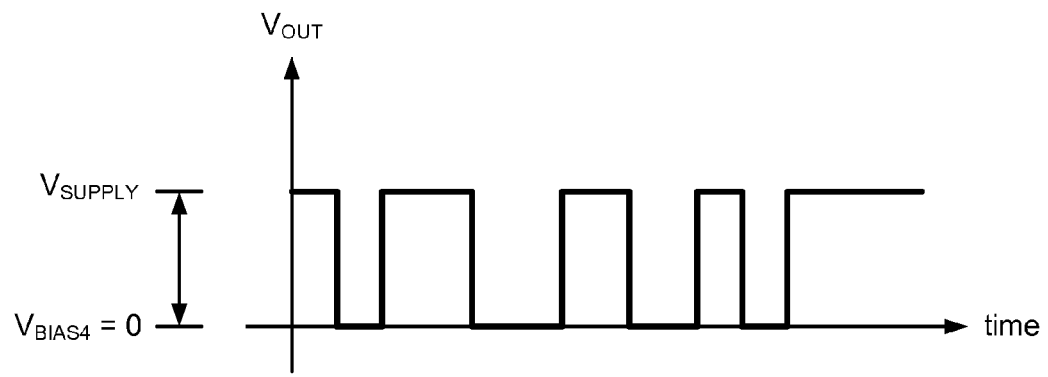
FIG. 3 is a simplified diagram of the RF output voltage produced by the RF PA in FIG. 1, highlighting the rail-to-rail output characteristics of the RF PA.

The first and second FETs 102 and 104 serve to convert DC power supplied from the DC power supply $V_{SUPPLY}$ to RF power, in accordance with the variations of the input RF signal $RF_{in}$. As was discussed above, the Class-D control of the output stage results in the first and second FETs 102 and 104 being out of phase. In other words, while the first FET 102 is ON the second FET 104 is OFF, and vice versa. FIG. 3 shows this rail-to-rail characteristic of the RF output voltage $V_{OUT}$ produced at the RF output 120 of the RF PA 100. As can be seen, the RF PA 100 produces a rail-to-rail RF output voltage $V_{OUT}$ that swings between $V_{SUPPLY}$ and $V_{BIAS4}=0$. When switching the first and second FETs 102 and 104 out of phase, there is ideally no overlap in the voltage and current waveforms produced at the RF output 120 of the RF PA 100. The RF PA 100 is therefore extremely efficient at converting DC power to RF power, having an ideal conversion efficiency of 100%. The Class-D configuration also obviates any need for a large drain inductor (i.e., choke), as is required in single-ended RF PA designs. This advantage along with the uncomplicated design of the single-phase driver, which requires only a single FET (as opposed to the two or more FETs required in dual-phase Class-D drivers) allows the RF PA 100 to be integrated in a small, compact monolithic microwave integrated circuit (MMIC).

Figure 4:
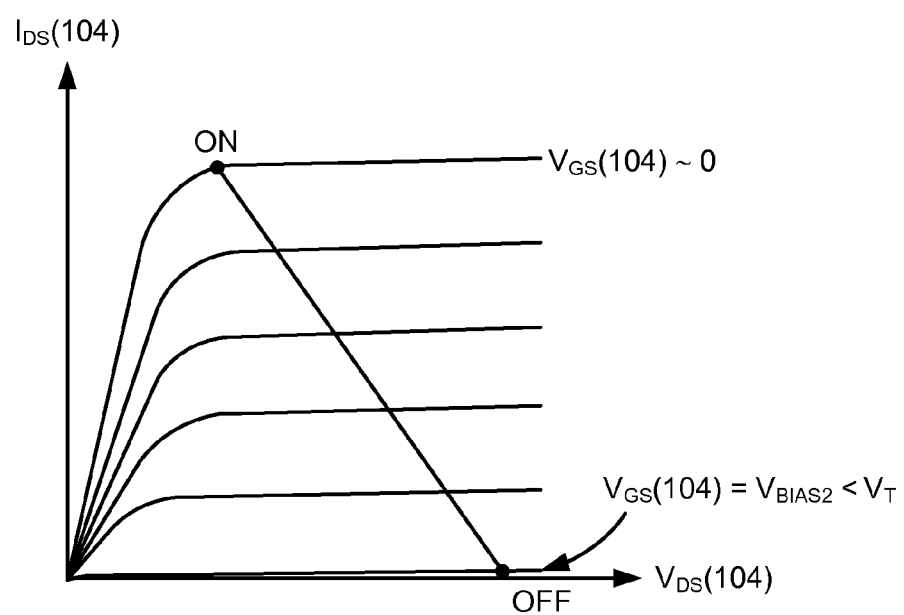
FIG. 4 is simplified drawing of the drain-source current ($I_{DS}$) versus drain-source voltage $V_{DS}$ characteristics of the second FET of the RF PA in FIG. 1, highlighting the switching between its ON (saturated) and OFF (cut-off) states.

The first FET 102 of the RF PA 100 is switched between its ON and OFF states under the direct control of the DC-biased input RF voltage $RF_{in}$ applied to its gate. The second FET 104 is switched between its ON and OFF states by the coordinated control and operation of the first FET 102, third FET 106, and bootstrap resistor 118. FIG. 4 is a drawing showing the $I_{DS}(104)$ versus $V_{DS}(104)$ characteristics of the second FET 104, highlighting the switching between its ON (saturated) and OFF (cut-off) states. Initially, when the second FET 104 is fully ON and the gate voltages $V_G(102)$ and $V_G(106)$ applied to the first and third FETs 102 and 106 subsequently increase to the upper ends of their swings (see FIGS. 2A and 2B above), the first and third FETs 102 and 106 turn ON, thereby pulling the gate of the second FET 104 down to $V_{BIAS2}$ and the source of the second FET 104 down to $V_{BIAS2}$. Since $V_{BIAS4}=0V$ and $V_{BIAS2}<V_T$, the gate-source voltage $V_{GS}(104)$ of the second FET 104 is clamped to a voltage less than (i.e., more negative than) the threshold voltage $V_T$. The input gate capacitor of the second FET 104 thus rapidly discharges through the third FET 106 into the bias supply $V_{BIAS2}$, causing the second FET 104 to turn OFF. Since the first FET 102 is ON when the second FET is OFF, the output voltage $V_{OUT}$ produced at the RF output 120 is therefore pulled down to $V_{BIAS4}$=0V. The second FET 104 will turn back ON when the gate voltages $V_G(\mathbf{102})$ and $V_G(\mathbf{106})$ applied to the gates of the first and third FETs 102 and 160 fall back down to the lower ends of their swings. When that condition occurs, the third FET turns OFF almost immediately and the bootstrap resistor 118 bootstraps current from the RF output 120 into the gate of the second FET 104. The bootstrap current is initially supplied by the second FETs 104's gate-source capacitor $C_{gs}$, which was previously reverse-charged by $V_{BIAS2}$ during the time the first and third FETs 102 and 106 were previously turned ON. However, shortly after the second FET 104 begins turning ON and as the first FET 102 is being turned OFF, current from the power supply $V_{SUPPLY}$ rapidly completes the forward charging of the gate-source capacitor $C_{gs}$. Forward charging the gate-source capacitor $C_{gs}$ happens very rapidly and can be completed on the order of picoseconds or less, depending on the resistance of the bootstrap resistor 118 and the capacitance of the gate-source capacitor $C_{gs}$. After the gate-source capacitor $C_{gs}$ has fully charged, the voltage drop across the bootstrap resistor 118 falls to zero (since no current is then flowing through it). Because the bootstrap resistor 118 is connected across the gate-source terminals of the second FET 104, the gate-source voltage $V_{GS}(\mathbf{104})$ of the second FET 104 also decreases to 0V. With a $V_{GS}(\mathbf{104})$=0V applied across its gate-source terminals, the second FET 104 is then fully ON and the output voltage $V_{OUT}$ produced at the RF output 120 is pulled up to the supply voltage $V_{SUPPLY}$. If necessary, the power supply $V_{SUPPLY}$ will supply additional current to the gate of the second 104, via the bootstrap resistor 118, in order to maintain the second FET 104 in its fully ON state. This bootstrapping effect will continue until the gate voltages $V_G(\mathbf{102})$ and $V_G(\mathbf{106})$ applied to the first and third FETs 102 and 106 once again increase to the upper ends of their swings and cause the second FET 104 to turn back OFF.

To optimize the performance of the RF PA 100, the resistance of the bootstrap resistor 118 and the capacitance of the gate-source capacitor $C_{gs}$ of the second FET 104 should be taken into consideration. It is desirable for the resistance of the bootstrap resistor 118 to be small, in order to minimize the turn on time of the second FET 104 during the time the second FET 104 is being turned ON. The turn on time of the second FET 104 is limited by the RC time constant presented by the gate-source capacitor $C_{gs}$ of the second FET 104 and the bootstrap resistor 118 (i.e., R(118)× $C_{gs}$). Accordingly, in order to realize a short RC time constant, either or both the capacitance of the gate-source capacitor $C_{gs}$ of the second FET 104 and the resistance of the bootstrap resistor 118 should be kept small. On the other hand, while it is desirable for the resistance of the bootstrap resistor 118 to be small in order to minimize the turn on time of the second FET, it is also desirable for the resistance of the bootstrap resistor 118 to be large enough that it maintains the second FET 104 in a fully OFF condition, when the second FET 104 should be OFF, and thereby prevent or reduce any potential shoot-through current through the first and second FETs 102 and 104. A higher resistance of the bootstrap resistor 118 will also have the desired effect of avoiding unnecessary $I^2R$ losses caused by leakage current through the bootstrap path when the first FET 102 is ON and the second FET 104 is OFF. Under low power applications, when $V_{SUPPLY}$ is low, it may be acceptable to make the resistance of the bias resistor 118 smaller than is necessary to prevent all shoot-through current and to accept a slight increase in leakage-current $I^2R$ loss as a tradeoff for reducing the turn on time of the second FET 104. However, for most high-power applications it is desirable for the resistance of the bootstrap resistor 118 to be large enough to be able to maintain the second FET 104 in a fully OFF condition during times when the second FET 104 should be OFF in order to prevent or at least substantially reduce any potential shoot-through current, since in general shoot-through current results in high power losses. Some or all of these effects and factors are taken into consideration in optimizing the performance of the RF PA 100.

Figure 5:
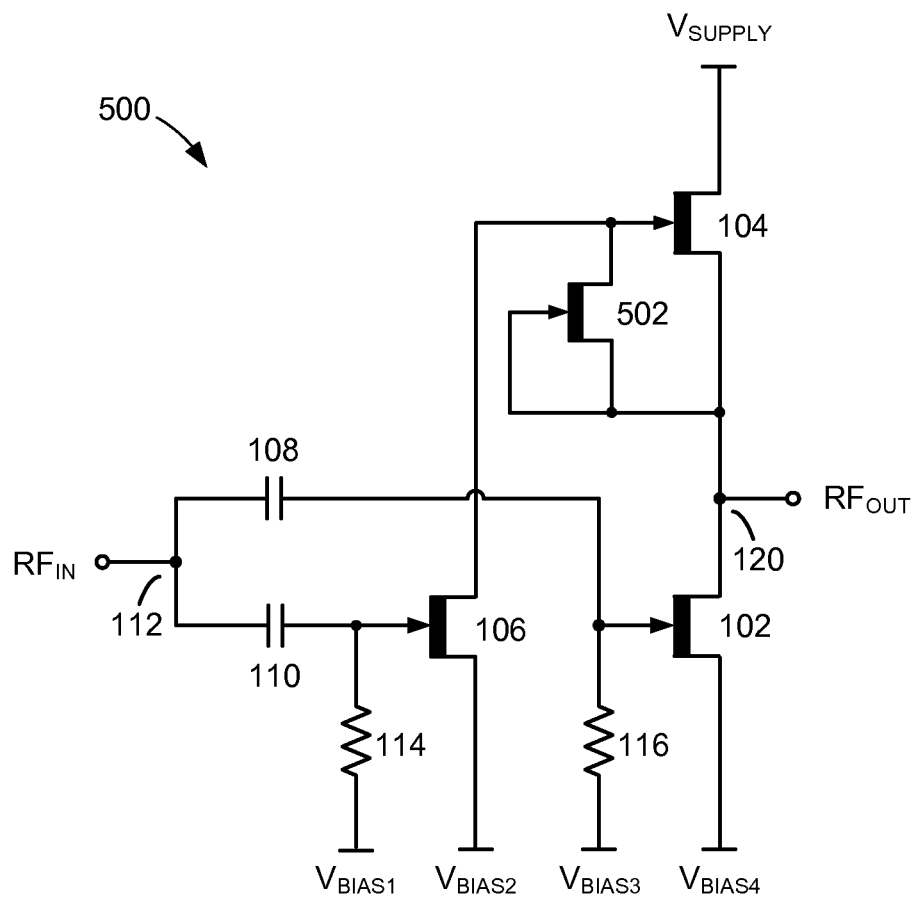
FIG. 5 is a schematic drawing of a high-power, high-frequency RF PA, according to another embodiment of the present invention.
Figure 6A:
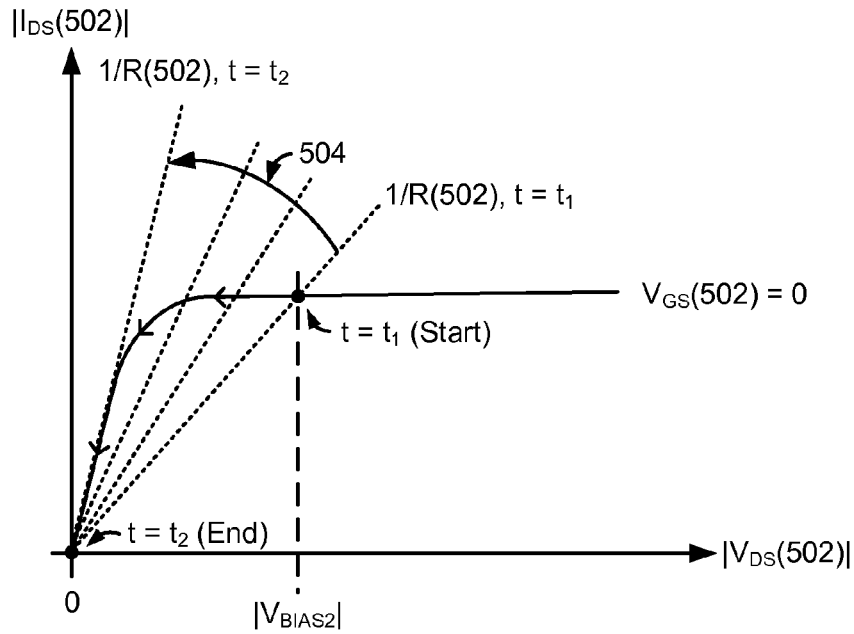
FIG. 6A is a drawing showing the drain-source current $I_{DS}$ versus drain-source voltage $V_{DS}$ characteristics of the fourth FET of the RF PA in FIG. 5 during times the second FET of the RF PA is being switched from a fully-OFF state to a fully-ON state.

FIG. 5 is a schematic drawing of an RF PA 500 according to another embodiment of the invention. The RF PA 500 is similar in construction to the RF PA 100 described above except that it utilizes an active device 502 with nonlinear resistance characteristics in the bootstrap path, rather than a linear fixed-resistance bootstrap resistor 118. The nonlinear resistance characteristics of the active device 502 are exploited to more effectively control the ON/OFF states of the second FET 104. (It should be noted that if the threshold voltage of the second FET 104 is very negative, multiple n-channel, depletion mode FETs 502 can be connected in series, rather than just a single active device 502.) In one embodiment of the invention the active device 502 is implemented using a fourth n-channel, depletion mode FET (referred to as the fourth FET 502 in the description below) with the gate of the fourth FET 502 shorted to its source, shown in FIG. 5. Note that since the gate of the fourth FET 502 is shorted to its source, the gate-source voltage $V_{GS}(\mathbf{502})$ of the fourth FET 502 is always 0V. Additionally, since the drain-source terminals of the fourth FET 502 are connected directly across the gate-source terminals of the second FET 102, the drain-source voltage $V_{DS}(\mathbf{502})$ of the fourth FET 502 is always equal to the gate-source voltage $V_{GS}(\mathbf{104})$ of the second FET 104, i.e., $V_{DS}(\mathbf{502})$=$V_{GS}(\mathbf{104})$. FIG. 6A is a drawing showing the $I_{DS}(\mathbf{502})$ versus $V_{DS}(\mathbf{502})$ characteristics of the fourth FET 502 during times the second FET 104 is being switched from a fully-OFF state to a fully-ON state. (Note that since the current through the bootstrap path flows through the fourth FET 502 from it source to its drain, $I_{DS}(\mathbf{502})$ and $V_{DS}(\mathbf{502})$ are both negative. For this reason, the absolute value $|I_{DS}(\mathbf{502})|$ is plotted versus the absolute value $|V_{DS}(\mathbf{502})|$ in FIG. 6A (and FIG. 6B below), rather than $I_{DS}(\mathbf{502})$ versus $V_{DS}(\mathbf{502})$.) Just prior to time t=$t_1$, the first and third FETs 102 and 106 are both fully ON and the second FET 104 is fully OFF with a gate-source voltage $V_{GS}(\mathbf{104})$=$V_{DS}(\mathbf{502})$=$V_{BIAS2}$<$V_T$ applied across the gate-source terminals of the second FET 104. Subsequently, when the gate voltages $V_G(\mathbf{102})$ and $V_G(\mathbf{106})$ applied to the gates of the first and third FETs 102 and 106 drop down to the lower ends of their swings, as in FIGS. 2A and 2B, the third FET 106 turns OFF almost immediately and the first FET 102 turns OFF as the second FET 104 is being turned ON. The second FET 104 is turned ON by current supplied from the power supply $V_{SUPPLY}$ and is bootstrapped into the gate of the second FET 104 via the fourth FET 502. As indicated by the increasing slopes of the 1/R(502) resistance lines 504 in FIG. 6A, the absolute resistance R(502) of the fourth FET (502) quickly reduces as the gate-source capacitor $C_{gs}$ of the second FET 104 charges between the start of the charging period (t=$t_1$) and the end of the charging period (t=$t_2$). The nonlinear resistance characteristics of the fourth FET 502 is exploited during this time period $t_1$ to $t_2$, so that for some times between $t_1$ and $t_2$ the absolute resistance R(502) presented by the fourth FET 502 is less than the fixed resistance that would otherwise be presented by the bootstrapping resistor 118 (see FIG. 1). The lower absolute resistance therefore allows the second FET 104 to transition from the fully OFF state to the fully ON state more rapidly than if the fixed-resistance bootstrapping resistor 118 was to be used.

Figure 6B:
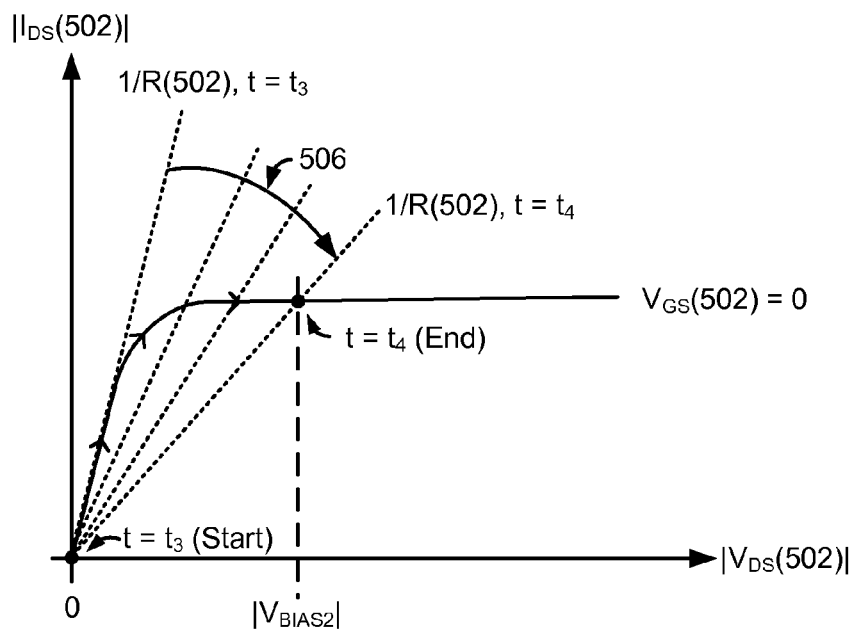
FIG. 6B is a drawing showing the drain-source current $I_{DS}$ versus drain-source voltage $V_{DS}$ characteristics of the fourth FET of the RF PA in FIG. 5 during times the second FET of the RF PA is being switched from a fully-ON state to a fully-OFF state.

The nonlinear resistance characteristics of the fourth FET 502 are also exploited during times the second FET 104 is being switched from a fully-ON state to a fully-OFF state, as illustrated in FIG. 6B. Just prior to time t=$t_3$, the first and third FETs 102 and 106 are both fully OFF and the second FET 104 is fully ON with a gate-source voltage $V_{GS}(104)$ =$V_{DS}(502)$=0V applied across its gate-source terminals. Subsequently, when the gate voltages $V_G(102)$ and $V_G(106)$ applied to the gates of the first and third FETs 102 and 106 increase to the upper ends of their swings, as in FIGS. 2A and 2B, the third FET 106 turns ON almost immediately and the first FET 102 turns ON as the second FET 104 is being turned OFF. The second FET 104 turns OFF during the time period between t=$t_3$ and t=$t_4$, discharging its gate capacitance through the third FET 106 into the bias supply $V_{BIAS2}$. During this time period, the absolute resistance R(502) of the fourth FET (502) quickly increases, as indicated by the decreasing slopes of the 1/R(502) resistance lines 506 in FIG. 6B. As the second FET 104 is being turned OFF, the increasing absolute resistance R(502) serves to resist current from the power supply $V_{SUPPLY}$ from flowing into the bootstrap path. Moreover, once the second FET 104 has completely turned OFF, the high absolute resistance presented by the fourth FET 502 continues to resist current from the bias supply $V_{BIAS4}$ from flowing into the bootstrap path. The fourth FET 104 is designed so that for some times between $t_3$ and $t_4$ its absolute resistance R(502) is greater than would be provided if a linear fixed-resistance (such as the linear fixed-resistance bootstrap resistor 118 in FIG. 1) was to be used. Hence, power dissipation in the bootstrap path is reduced during the discharge time period $t_3$ to $t_4$, compared to the dissipation that would occur if the fixed-resistance bootstrap resistor 118 was used. Since the final absolute resistance R(502) presented by the fourth FET 502 is greater than the resistance that would be provided by the fixed-resistance bootstrap resistor 118, power dissipation in the bootstrap path is also reduced after the second FET 104 has been fully turned OFF. Moreover, since the final absolute resistance R(502) presented by the fourth FET 502 is greater than the resistance that would be provided by the fixed-resistance bootstrap resistor 118, the higher resistance R(502) presented by the fourth FET 502 is more effective at maintaining the second FET 104 in a fully OFF condition and consequently more effective at preventing any potential shoot-through current through the first and second FETs 102 and 104.

Figure 7:
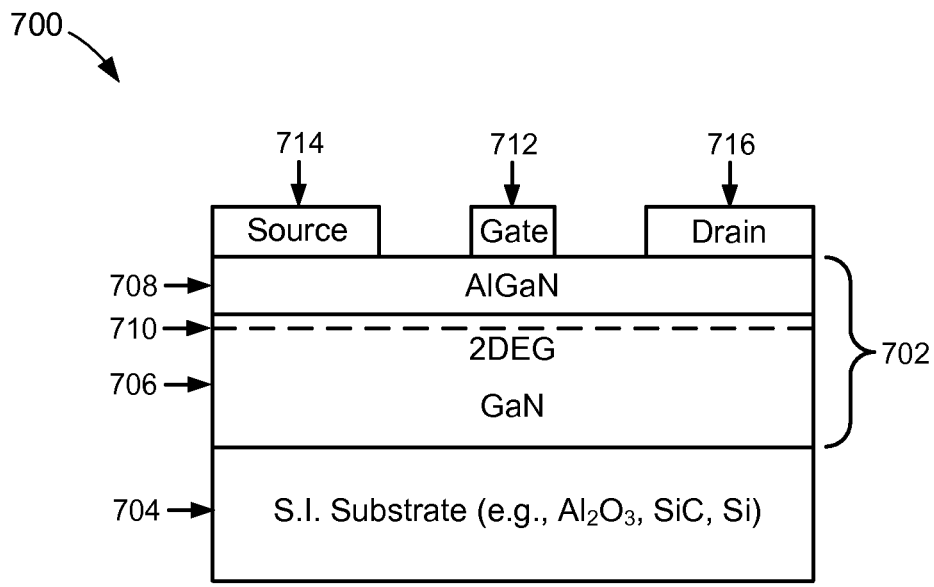
FIG. 7 is a simplified cross-sectional drawing depicting the various material layers and physical properties of one of the aluminum gallium nitride/gallium nitride AlGaN/GaN HEMTs (GaN-HEMT) used in the RF PA in FIG. 1 and RF PA in FIG. 5, in accordance with embodiments of the present invention.

The RF PAs 100 and 500 of the present invention are designed to operate at microwave frequencies (e.g., up to single and even tens of GHz), are designed to produce very high RF output powers (tens to even possibly hundreds of watts), and are naturally capable of operating with high conversion efficiencies over a wide range of microwave frequencies, even exceeding one decade. The RF PAs 100 and 500 described above are thus well-suited for high-power, high-frequency operation, such as is required or desired in military (e.g., radar), advanced communications systems, and high-power converters. To further facilitate the high-power, high-frequency, wideband operation, the FETs of the RF PA 100 and the FETs of the RF PA 500 can be implemented using aluminum gallium nitride/gallium nitride (AlGaN/GaN) n-channel, depletion mode high electron mobility transistors (i.e., n-channel depletion mode GaN-HEMTs. FIG. 7 is a simplified cross-sectional drawing depicting the various material layers and physical properties of one of the GaN-HEMTs 700 used in the RF PA 100 and the RF PA 500. The GaN-HEMT 700 comprises an AlGaN/GaN heterostructure 702, which is grown on a semi-insulating (S.I.) substrate 704, such as silicon-carbide (SiC), sapphire ($Al_2O_3$) or silicon (Si), using molecular beam epitaxy (MBE), metal-organic chemical vapor deposition (MOCVD), or other suitable fabrication method. The GaN and AlGaN layers 706 and 708 are grown with a polar Ga-face crystal orientation. The GaN and AlGaN layers 706 and 708 materials are also naturally piezoelectric. Accordingly, when the AlGaN layer 708 is grown over the GaN layer 706, a spontaneous polarization dipole attributable to the polar nature of the GaN and AlGaN layers 706 and 708 and a piezoelectric polarization dipole caused by tensile strain of the GaN and AlGaN layers 706 and 708 is formed across the AlGaN/GaN heterostructure 702. The combined effect of the spontaneous and piezoelectric dipoles is to create a net positive charge at the AlGaN/GaN heterojunction 702. The resulting net positive charge induces a highly concentrated two-dimensional electron gas (2DEG) 710 in the GaN layer 706, near the AlGaN/GaN heterojunction 702. Unlike other types of III-V compound heterostructures, such as, AlGaAs/GaAs heterostructures, which are modulation-doped to create the 2DEG, no doping is necessary to create the 2DEG 710 in the GaN-HEMT 700. Instead, the 2DEG 710 is created by electron-donating surface states that donate electrons, which are then attracted to the net positive charge formed at the AlGaN/GaN heterojunction 702 by the aforementioned spontaneous and piezoelectric polarization dipoles.

Figure 8:
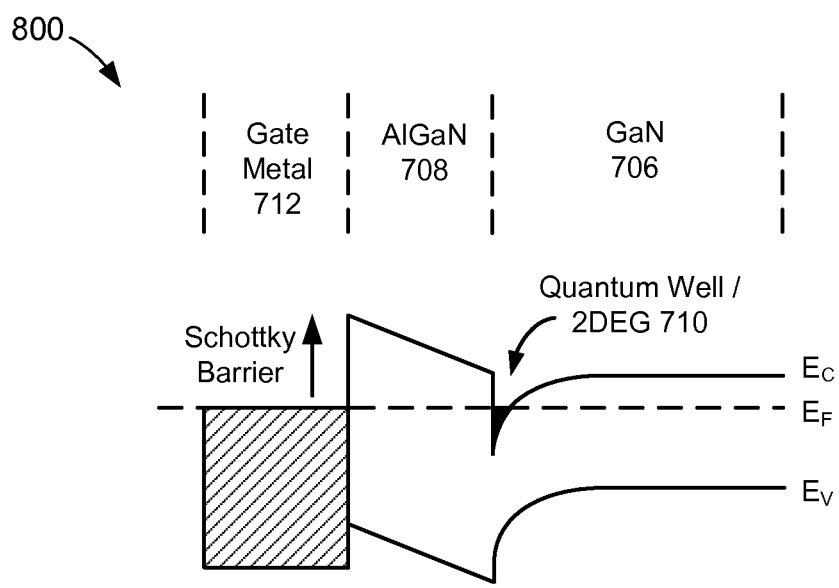
FIG. 8 is a simplified energy band diagram of the GaN-HEMT in FIG. 7.

As shown in the simplified energy band diagram 800 of the GaN-HEMT 700 in FIG. 8, the differing bandgaps of the GaN and AlGaN layers 706 and 708 cause the conduction and valence bands of the two materials to bend and distort when the AlGaN layer 708 is grown on the GaN layer 706. The band bending and distortion results in what is referred to as a quantum well within which the 2DEG 710 is formed. The mole fraction of Al in the AlGaN layer 706 can be increased to enhance the piezoelectric dipole and consequently the conductivity and electron transport performance of the 2DEG 710, but is usually maintained to a value of less than 0.3 in order to avoid formation of misfit dislocations and cracking. The AlGaN layer 708 is also usually grown to a thickness much less than the thickness of the GaN layer 706 so that the lattice mismatch between the two materials is accommodated by elastic strain rather than by formation of dislocations.

Due to the unique energy band structure of the AlGaN/GaN heterojunction 702 and the polarization-induced 2DEG 710, the 2DEG 710 (or "conducting channel") is present in the GaN-HEMT 700 at equilibrium (i.e., when no voltages are being applied to the gate 712 of the GaN-HEMT 700), and the conducting channel extends from the GaN-HEMT's source 714 to its drain 716. The GaN-HEMT 700 is therefore an n-channel, depletion mode (or "normally on") device that is naturally suited for use in the high-frequency, high-power RF PAs 100 and 500 of the present invention.

The GaN-HEMT 700 can be manufactured to have a very high peak drift velocity (e.g., approaching $3\times10^7$ cm/s) and inherently has a very high breakdown voltage (hundreds of volts). This combination of attributes allows the RF PAs 100 and 500 to produce very high RF output powers at microwave frequencies. The GaN-HEMT 700 can also be manufactured to have a power density that is an order of a magnitude or greater than the power density realizable in silicon (Si) based and gallium arsenide (GaAs) based FETs. Exploiting this superior power density, the high energy efficiency realized by the switch-based designs of the RF PAs 100 and 500, and the higher thermal conductivity of GaN (which is about four times higher than GaAs), allows a much smaller heatsink to be used to dissipate heat, compared to the heatsink that would be required in a conventional GaAs-based RF PA of comparable RF output power. The order-of-magnitude superiority in power density combined with the fact that neither the RF PA 100 nor the RF PA 500 require a large drain supply inductor (as is required in single-ended RF PA designs) further afford the ability to manufacture the RF PAs 100 and 500 in small, compact MMICs, each of which is substantially smaller in size (in some instances, ten times smaller) than the size of the MMICs of conventional Si-based or GaAs-based RF PAs of comparable output power.

While various embodiments of the present invention have been presented, they have been presented by way of example and not limitation. It will be apparent to persons skilled in the relevant art that various changes in form and detail may be made to the exemplary embodiments without departing from the true spirit and scope of the invention. Accordingly, the scope of the invention should not be limited by the specifics of the exemplary embodiments of the invention but, instead, should be determined by the appended claims, including the full scope of equivalents to which such claims are entitled.

What is claimed is:

1. An amplifier, comprising:
   a first field-effect transistor (FET) having a gate, a drain configured to be coupled to a power supply, and a source;
   a second FET having a gate, a drain coupled to the source of the first FET, and a source;
   a bootstrap path including a resistive element coupled between the gate and source of the first FET;
   a third FET having a gate, a drain coupled to the gate of the first FET, and a source; and
   an input terminal that is capacitively coupled to the gates of both the second and third FETs and which is configured to receive a common switch drive signal that drives both the second and third FETs,
   wherein the source of the second FET is configured to be biased by a first bias voltage and the third FET is configured to be biased by a second bias voltage lower than the first bias voltage.

2. The amplifier of claim 1, wherein the gates of the first and second FETs have larger areas than an area of the gate of the third FET.

3. The amplifier of claim 1, wherein the second bias voltage is lower than the first bias voltage by at least one FET threshold voltage.

4. The amplifier of claim 1, wherein the first, second, and third FETs are gallium nitride FETs.

5. In a Class-D output stage that includes a first field-effect transistor (FET) and a second FET, a method of switching the first FET ON and OFF, comprising:
   providing a bootstrap path including a resistive element between the source and gate of the first FET;
   switching the second FET, which has its drain coupled to the source of the first FET, and a third FET, which has its drain coupled to the gate of the first FET, OFF, in response to a common switch drive signal, to allow a voltage across the bootstrap path to rise to a level greater than a threshold voltage of the first FET and thereby switch the first FET ON;
   biasing the source of the second FET to a first bias voltage;
   biasing the source of the third FET to a second bias voltage that is at least one threshold voltage lower than the first bias voltage; and
   switching the second and third FETs ON, in response to the common switch drive signal, to force the voltage across the bootstrap path to a value less than the threshold voltage of the first FET and thereby switch the first FET OFF.

6. The method of claim 5, wherein the gates of the first and second FETs have larger areas than an area of the gate of the third FET.

7. The method claim 5, wherein the source of the second FET is configured to be biased by a first bias voltage and the third FET is configured to be biased by a second bias voltage lower than the first bias voltage.

8. The method of claim 5, wherein the first, second, and third FETs are gallium nitride FETs.

* * * * *